United States Patent

Winnik et al.

[11] Patent Number: 5,100,471
[45] Date of Patent: Mar. 31, 1992

[54] LIQUID INK COMPOSITIONS

[75] Inventors: Francoise M. Winnik, Toronto; Peter G. Hofstra, Hamilton, both of Canada

[73] Assignee: Xerox Corporation, Stamford, Conn.

[21] Appl. No.: 544,558

[22] Filed: Jun. 27, 1990

[51] Int. Cl.$^5$ ............................................. C09D 11/00
[52] U.S. Cl. .......................................... 106/23; 106/20; 106/22; 106/32
[58] Field of Search ...................... 106/20, 21, 22, 490; 8/647

[56] References Cited

U.S. PATENT DOCUMENTS

| | | | |
|---|---|---|---|
| 3,554,946 | 1/1971 | Okuno et al. | 252/62.1 |
| 3,656,981 | 4/1972 | Beschke et al. | 106/491 |
| 3,869,397 | 3/1975 | Tellier | 252/62.1 |
| 3,900,412 | 8/1975 | Kosel | 252/62.1 |
| 3,939,087 | 2/1976 | Vijayendran et al. | 252/61.1 L |
| 4,476,210 | 10/1984 | Groucher et al. | 430/114 |
| 4,794,651 | 12/1988 | Landa et al. | 430/110 |
| 4,877,451 | 10/1989 | Winnik et al. | 106/23 |

Primary Examiner—William R. Dixon, Jr.
Assistant Examiner—Margaret V. Einsmann
Attorney, Agent, or Firm—E. O. Palazzo

[57] ABSTRACT

An aqueous ink jet composition comprised of a solvent and colored particles comprised of a polymeric core and a silica shell onto which dyes are covalently bonded.

25 Claims, No Drawings

LIQUID INK COMPOSITIONS

BACKGROUND OF THE INVENTION

This invention is directed to ink and liquid developer compositions, and more specifically to the aforementioned compositions with a polymer core coated with a silica shell onto which reactive dyes have been grafted. In one embodiment, the present invention is directed to heterophase ink jet inks comprised of water, a solvent such as an alkylene glycol, and pigment comprised of a polymer core with a coating thereover of a silica shell, and wherein the shell has grafted thereon reactive dyes. In another embodiment of the present invention there are provided liquid developer compositions comprised of a liquid hydrocarbon medium, a polymeric material soluble in the liquid medum, a charge control agent, and colored particles comprised of a polymeric core with a coating thereover of a silica shell onto which have been chemically grafted reactive dyes. The pigment or pigments selected for the ink jet inks, and liquid developers of the present invention in one embodiment thereof is comprised, for example, of a polymer core, such as poly(methylmethacrylate), with a small effective average particle diameter of from about 0.05 to 4 microns, and preferably from about 0.1 to about 2 microns, and preferably of a density as determined with a Micromeritics Autopycnometer of from about 0.9 gram per cubic centimeter to 1.2 grams per cubic centimeter, which core is coated with an effective thin silica shell of, for example, about 0.002 to about 0.030 micron, and preferably from about 0.005 to about 0.01 micron in thickness, and onto which reactive dyes are grafted to thereby impart color to the ink composition. Also, the present invention is directed to positively charged or negatively charged liquid developers where known charge directors such as barium petroates, Lecithin and the like are selected to permit negatively charged developers, and known charge directing components such as zirconium octoate, iron naphthenate, and a polyisobutylene based polyester are selected to permit positively charged developers. The compositions of the present invention can be selected for the development of images in various imaging processes providing, for example, that the ink jet inks are selected for ink jet printing processes, including the liquid development processes described in U.S. Pat. No. 3,084,043, the disclosure of which is totally incorporated herein by reference; xerographic processes, electrographic recording, electrostatic printing, and facsimile systems; color proofing processes; and the process as illustrated in British Patent Publication 2,169,416, published July 9, 1986, and U.S. Pat. No. 4,794,651, the disclosures of which are totally incorporated herein by reference.

Development of electrostatic latent images with liquid developer compositions comprised of, for example, a dispersion of pigments in a liquid hydrocarbon is known. In these methods, the electrostatic latent image, which is usually formulated on a single sheet of photoconductive paper, such as zinc oxide, is transported through a bath of the aforementioned liquid developer. Contact with the liquid developer causes the charged pigment particles present therein to migrate through the liquid to the zinc oxide sheet in the configuration of a charged image. Thereafter, the sheet is withdrawn from the liquid developer bath with the charged pigment particles adhering to the electrostatic latent image in image configuration. The thin film of residual developer remaining on the surface of the sheet is then evaporated within a relatively short time period, usually less than 5 seconds. Also, the marking pigment particles may be fixed to the sheet by heat, for example, in image configuration.

There are disclosed in U.S. Pat. No. 3,554,946 liquid developers for electrophotography comprised of a carrier liquid with a hydrocarbon, negatively electrostatically charged toner particles dispersed in the carrier liquid, and a pigment therein such as carbon black, aniline black, prussian blue, phthalocyanine, blue and cadmium yellow. In accordance with the teachings of this patent, a copolymer is coated on the surface of the pigment particles for the primary purpose of imparting a negative electrostatic charge to these particles. Other patents disclosing liquid developer compositions include U.S. Pat. Nos. 3,623,986; 3,625,897; 3,900,412; 3,976,583; 4,081,391 and 3,900,412. In the '412 patent, there is disclosed a stable developer comprised of a polymer core with a steric barrier attached to the surface of the polymer selected. In column 15 of this patent, there are disclosed colored liquid developers by selecting pigments or dyes, and physically dispersing them by ball milling or high shear mixing. Attempts to obtain useful color liquid developer compositions by the ball milling process described have been, it is believed, substantially ineffective, particularly with respect to obtaining developed images of acceptable optical density in that, for example, the desired size for the latex particles is from 0.2 to 0.3 micron in diameter; and with ball milling techniques, it can be difficult to provide a dispersion of carbon black or other pigment particles much smaller in size than about 0.7 to about 0.8 micron. Consequently, the addition of carbon black pigment particles, for example, to latex particles with a diameter of 0.2 to 0.3 micron while ball milling would result in relatively small latex particles residing on the surface of the pigment particles.

Additionally, there are described in U.S. Pat. No. 4,476,210, the disclosure of which is totally incorporated herein by reference, liquid developers containing an insulating liquid dispersion medium with submicron size marking particles therein, which particles are comprised of a thermoplastic resin core substantially insoluble in the dispersion, an amphipathic block or graft copolymeric stabilizer irreversibly chemically or physically anchored to the thermoplastic resin core, and a colored dye imbibed in the thermoplastic resin core. There is also illustrated in this patent the use of zirconium octoate as a positive charge control agent with a vinyl resin and Isopar ® Information regarding liquid developers is provided in the '210 patent, reference columns 1 and 2 thereof.

Also of interest are U.S. Pat. No. 3,869,397, the disclosure of which is totally incorporated herein by reference, which discloses the use of zirconium octoate as a negative charge control agent for a carbon black pigment in a vinyl resin, and U.S. Pat. No. 3,939,087, the disclosure of which is totally incorporated herein by reference, which illustrates, for example, a liquid developer comprising a pigment, dye and polymer with zirconium octoate in Isopar ®, which octoate can apparently function as a charge director.

In addition, there are illustrated in the aforementioned British Patent Publication 2,169,416 and U.S. Pat. No. 4,794,651 liquid developer compositions comprising toner particles associated with a pigment dispersed in a nonpolar liquid, and wherein the toner particles are formulated with a plurality of fibers or tendrils from a thermoplastic polymer, and carry a charge of polarity opposite to the polarity of the latent image. These toners apparently permit, in some instances, excellent transfer efficiencies, and exhibit excellent copy quality.

Furthermore, there is illustrated in application U.S. Ser. No. 846,164 (now abandoned), entitled Black Liquid Developer Composition, the disclosure of which is totally incorporated herein by reference, stable black submicron liquid developer comprised of an insulating liquid medium having dispersed therein black marking particles comprised of a thermoplastic resin core, which is substantially insoluble in the dispersion medium, and chemically or physically anchored to the resin core an amphipathic block or graft copolymer steric stabilizer, which is soluble in the dispersion medium; and wherein dyes comprised of a specific mixture are imbibed in the thermoplastic resin core with the mixture of dyes being dispersible at the molecular level, and therefore soluble in the thermoplastic resin core and insoluble in the dispersion medium.

Other U.S. patents of interest include U.S. Pat. No. 4,210,805 which discloses toner particles prepared by adding a solvent solution of polyvinylcarbazole to Isopar ® wherein the diameter of the particles is a function of the ratio of solvent to Isopar ®, reference column 8; U.S. Pat. No. 4,032,463 which illustrates that the ratio of toluene to Isopar ® effects toner resin particle size; and U.S. Pat. No. 3,766,072 which appears to disclose that resin solvency in the vehicle effects the particle size. Also, in the '463 and '072 patents it is indicated that a solvency increase of the dispersion medium provides a larger final size particle. This occurs, it is believed, because one of the liquids used in formulating such developers is a solvent for the resin that is used. Consequently, the particle will be swollen by the entrapped solvent in the particle yielding a larger particle size. Also, in the polymerization process changing the solvent/nonsolvent ratio of the dispersion medium changes the kinetics and thus the mechanism by which particles are formed. With latex particle polymerization in a hydrocarbon media, usually only submicron size particles are envisioned, reference for example "*Dispersion Polymerization in Organic Media*", ed. K. E. J. Barrett, Academic Press, 1975. However, it has been shown, reference M. A. Winnik, R. Lukas, W. F. Chen, P. Furlong, and M. D. Croucher, *Makromol. Chem.*, Makromol. Symp. 10/11, 488, (1987), that by varying the solvent/nonsolvent ratio of the dispersion medium for the polymer particle being formed that the particle size may be altered and particles up to 15 microns diameter may be formed. The advantage of this technique for liquid developers has recently been described in U.S. Pat. No. 4,789,616, the disclosure of which is totally incorporated herein by reference.

Although the above described liquid inks are suitable in most instances for their intended purposes, there remains a need for improved inks which can be positively charged enabling their utilization, for example, with layered imaging members which are negatively charged, reference U.S. Pat. No. 4,265,990, the disclosure of which is totally incorporated herein by reference. There is also a need for negatively charged inks which can be selected for imaging and printing processes wherein inorganic imaging members including chalcogenides, such as selenium, selenium alloys, doped selenium substances, and doped selenium alloys, including specifically selenium arsenic, selenium tellurium, selenium tellurium arsenic, and the like optionally doped with from, for example, about 200 to about 500 parts of a halogen, such as chlorine, are utilized. Additionally, there is a need for liquid inks containing dyes soluble in the resin binder and insoluble in the carrier component, such as Isopar. Also, there is a need for heterophase ink jet compositions with pigments comprised of a polymeric core coated with a thin silica shell onto which have been grafted dyes and wherein the resulting inks have minimal or substantially no pigment settlement thereby preventing or substantially minimizing undesirable clogging of the ink jets selected for known ink jet printing processes including drop-on-demand systems. Further, there is a need for ink jet compositions that can be selected for a number of imaging processes including those illustrated in U.S. Pat. No. 3,084,043, U.S. Pat. No. 4,794,651, and British Publication 2,169,416 (corresponds to the aforementioned '651 patent), the disclosures of which are totally incorporated herein by reference. An advantage associated with the inks of the present invention resides in the formation of brighter, clearer colors on paper. Another advantage associated with the inks of the present invention in embodiments thereof resides in their thermal stability at temperatures of from about 0° to about 280° C. of the pigments as a result of the silica shell coating of the polymeric cores. Yet another advantage associated with the inks of the present invention in embodiments thereof resides in desirable waterfastness in a range of from about 80 to about 98 percent of the resulting prints as a result of the grafting of the dyes to the polymeric particles. The aforementioned and other advantages are applicable to the ink jet ink compositions of the present invention and the liquid developer compositions illustrated herein in embodiments thereof. Accordingly, while in some instances the present application may refer to ink jet compositions, the reference is substantially equally applicable to liquid developers unless otherwise noted, especially with respect to the objects and advantages achievable with the compositions of the present invention as well as the utilities thereof.

SUMMARY OF THE INVENTION

It is the object of the present invention to provide ink jet inks and liquid developers with many of the advantages illustrated herein.

Yet another object of the present invention is to provide ink jet compositions and liquid developers with pigments comprised of a polymer core coated with a silica shell and wherein the shell has reactive dyes grafted thereon for the primary purpose of imparting color thereto, and wherein pigment settling is avoided or minimized for the resulting inks.

It is yet an object of the present invention to provide ink jet inks that exhibit excellent waterfastness, reduced feathering, and compatibility with plain paper.

In another object of the present invention there are provided heterophase dispersions, for example, in an aqueous medium of attrited pigments inks wherein the particles thereof are thermally stable.

It is another object of the present invention to provide ink jet inks in a wide variety of colors.

Another object of the present invention is to provide ink jet inks with minimal pigment toxicity compared to ink jet inks consisting of solutions of low molecular weight dyes.

Moreover, in another object of the present invention there are provided liquid ink compositions and liquid developers useful in various development systems inclusive of electrostatic, printing, color proofing methods, and the like.

It is another object of the present invention to provide liquid developers of different colors, all containing the same charge control agent. Another object of the present invention is to provide liquid developers wherein the average diameter pigment particle size is, for example, from 0.050 to 3 microns and the pigment particle size distribution with a GSD of from about 1.2 to 1.7 can be effectively controlled by the selection of a polymeric core having a diameter of from about 0.045 to about 3 microns and a particle size distribution with a GSD of from about 1.2 to 1.7. Another object of the present invention is to provide recording liquids containing colorant particles with a high degree of transparency, thereby enhancing color quality and enabling the formation of high quality full color images by sequentially applying images of primary colors to a single substrate, each successive image being applied on top of the previous image.

Furthermore, another feature of the present invention is the provision of silica containing dyes or dye particles for heterophase ink jet inks, which dyes are comprised of a polymeric core with an average diameter of less than 100 nanometers (nm), and a density of from about 0.9 to about 1.2 grams/cm$^{-3}$ coated with a thick, from for example about 5 to about 10 nanometers, silica shell onto which reactive dyes are grafted wherein the bulk properties of the pigment, especially their density (specific gravity), can be controlled by the core material and the surface characteristic by the silica.

These other objects and features of the present invention can be accomplished in embodiments thereof by providing heterophase ink jet ink compositions and liquid developers. In one embodiment the present invention is directed to ink jet ink compositions comprised of water, a solvent such as glycol, and pigment particles comprised of a polymer core with a coating thereover of a silica shell onto which have been chemically grafted reactive dyes. Also, in another embodiment of the present invention the inks are comprised of water, a polymeric additive, an alkylene glycol, and a pigment comprised of a polymer core containing a continuous coating of a silica shell onto which have been grafted reactive dyes. Moreover, there is provided in accordance with the present invention an aqueous ink jet composition comprised of water, a solvent, an optional known biocide, an optional known humectant, and colored pigment particles comprised of a polymeric core, and a silica shell onto which reactive dyes are covalently bonded; and a liquid developer composition comprised of a liquid hydrocarbon medium, a polymeric material soluble in the liquid medium, a charge control agent, and colored particles comprised of a polymeric core with a coating thereover of a silica shell onto which have been chemically grafted reactive dyes. Generally, for the ink the colored partcles are comprised of a polymer in an amount of, for example, from about 90 to about 99 and preferably from about 95 to about 99 weight percent; silica in an amount of from 0.1 to about 5 weight percent, for example, and preferably from about 0.5 to 3 weight percent based on the total weight of the colored particles; and a reactive dye in an amount of from about 1 to about 10 weight percent, for example, and preferably from about 2 to about 8 weight percent; and wherein the colored particles are present in an amount of from 1 to about 10 weight percent, for example, and from about 4 to about 8 percent of the entire ink.

Moreover, in another embodiment of the present invention the ink jet inks of the present invention are comprised of a liquid medium into which the particles, which may be polymeric particles, such as polystyrene particles, poly(methylmethacrylate) or crosslinked polymeric particles are coated with a silica shell onto which dyes are grafted as illustrated herein are dispersed. The liquid medium generally comprises water, which may be distilled water, in an effective amount of, for example, from about 40 to 95, and preferably about 50 to about 70 percent by weight, and solvent such as a glycol or mixture of glycols in an effective amount such as, for example, from about 5 to about 50, and preferably from about 10 to about 30 weight percent with a carbon chain length of from about 2 to about 8 carbon atoms, and preferably from about 2 to about 4 carbon atoms, such as ethylene glycol, diethylene glycol, propylene glycol, 1,2-propanediol, 1,3-butanediol, 1,4-butanediol, 2,3-butanediol, 1,5-pentanediol, hexylene glycol, and 1,2,6-hexanetriol and the like, and mixtures thereof, for example, from about 40 to 95 percent by weight of ethylene glycol and from about 5 to 60 percent by weight of a second glycol component. The liquid medium may, as indicated herein, comprise water, preferably present in an amount of from about 80 to about 95 percent by weight, and a water-miscible solvent, such as dimethylsulfoxide, sulfolane, N-methylpyrrolidone, or dimethyl formamide, preferably present in an amount of from about 5 to about 20 percent by weight. The liquid medium may also include a biocide to prevent bacterial growth upon storage of the ink, such as sorbitol, and the like, present in an amount of from about 0.1 to about 1 percent by weight of the water/glycol liquid medium, surfactants to enhance the dispersion of the particles in the ink, such as sodium dodecylsulfate, cetyl trimethyl ammonium chloride, Triton X-100, and the like, present in an amount of from about 0.1 to about 10 percent by weight of the water/glycol liquid medium, and/or dispersants such as polyethylene glycol-1500, poly-N-vinylpyrrolidone, Daxad 30S, Daxad 19, Solsperse 20,000 and the like, present in an amount of from about 0.1 to about 1.0 percent by weight of the water/glycol liquid medium.

The ink jet compositions of the present invention can be prepared by a number of methods including dispersing the colored particles in water by methods such as, for example, mechanical stirring or sonication, after which the glycol and any other ingredients are added. The suspension thus obtained may be filtered through a 1 micron filter to remove particles exceeding 1 micron in size. A process embodiment of the present invention comprises the following steps. An aqueous dispersion of polymer particles of an average diameter, for example, of from about 0.05 to 0.2 micron in an amount of from about 10 to about 40 weight percent is shaken or stirred mechanically and retained at a temperature of from about $-20°$ C. to about 50° C. To this dispersion is added dropwise a tetraalkoxysilane in an amount of from about 1 to about 10 weight percent. After completion of the addition, the dispersion is stirred for a short time period, for example from about 1 to about 60 minutes. To the dispersion is then added a solution comprised of water and a concentrated alkaline component, such as ammonium hydroxide, in amounts of from about 2 to about 40 weight percent. The resulting mixture is then stirred at a constant temperature of from about −20° C. to about +50° C. for reaction times of from about 2 hours to about 48 hours. After being brought to 25° C. be either cooling or heating, the mixture is treated with an aqueous acid solution to bring the pH of the suspension medium in a range of from about 7.5 to about 8.5. A solution in water of a reactive dye, such as those used in the textile industry, in an amount of from about 5 to about 30 weight percent is then added to the stirred dispersion. The mixture is stirred and maintained at a temperature of from about 20° C. to about 60° C. for reaction times of from 1 hour to 24 hours. After this time period, the mixture is brought to 25° C. The resulting colored pigment particles comprised of polymer core with a coating of silica, onto which reactive dyes have been grafted, are separated from the dispersion by techniques such as centrifugation with a Beckman Centrifuge or ultrafiltration with a Minitan Acrylic System from Millipore. They can be further purified by suitable techniques such as further ultrafiltration or repeated centrifugations and redispersions in water to remove excess unreacted dye. Subsequently, the particles are dried by known techniques such as freeze drying from a water suspension held at a temperature of from about −40° C. to about −10° C. or spray drying. To the resulting pigment particles are added water and glycol to enable formation of the ink jet inks as indicated herein.

The ink jet compositions of the present invention can be selected for use in known ink jet printing processes, and the like. More specifically, the inks of the present invention may be incorporated into an ink jet printer, such as the Diablo C150 IJ printer or the Hewlett Packard Desk Jet printer, and the like. Images may be generated onto substrates such as transparencies, plain paper, coated paper, cloth, and the like by ejecting droplets of the ink onto the substrate to form an image by ink jet printing processes, such as continuous stream, piezoelectric drop-on-demand, bubble jet or thermal ink jet processes.

In another embodiment, the present invention is directed to a liquid developer suitable for the development of electrostatic latent images, which developer comprises colored particles comprised of a polymer core with a coating thereover of a silica shell onto which have been chemically grafted reactive dyes, a liquid medium, a polymeric material soluble in the liquid medium, and a charge control agent. Typical liquid media are comprised of components that are colorless, odorless, nontoxic and nonflammable with flash points generally greater than 104° F., such as aliphatic hydrocarbons, such as high purity alkanes with, for example, from about 7 to about 18 carbon atoms, such as Norpar 12, Norpar 13, and Norpar 15, available from Exxon Corporation, isoparaffinic hydrocarbons such as Isopar ® G, H, L, and M, available from Exxon Corporation, Amsco 460 Solvent, Amsco OMS, available from American Mineral Spirits Company, Soltrol, available from Phillips Petroleum Company, Pagasol, available from Mobil Oil Corporation, Shellsol, available from Shell Oil Company, and the like. Generally, the liquid hydrocarbon medium is present in a large amount in the developer composition, and constitutes that percentage by weight of the developer not accounted for by the other components. The liquid medium is usually present in an amount of from about 90 to 99.5 percent by weight, although this amount may vary from about 70 to about 99.5 percent by weight.

The colored particles comprised of a polymer core, which may comprise any suitable themoplastic resin, including acrylate polymers and polymers of vinyl monomers, such as for example poly(vinyl acetate), poly(N-vinyl-2-pyrrolidone), poly(methyl methacrylate), poly(methylacrylate), poly(ethyl acrylate), poly(ethyl methacrylate), poly(2-ethoxyethyl methacrylate), poly(butoxy ethoxy ethyl methacrylate), poly(dimethylaminoethyl methacrylate), poly(acrylic acid), poly(methacrylic acid), poly(acrylamide), poly(methacrylamide), poly(methyl acrylamide), poly(ethyl acrylamide), poly(ethyl methacrylamide), poly(N-isopropyl acrylamide), poly(N-isopropyl methacrylamide), poly(acrylonitrile), poly(vinyl chloride), poly(ureidoethyl vinyl ether), and polystyrene with a coating thereover of a silica shell onto which have been chemically grafted reactive dyes, are generally present in an amount from about 0.1 to 8 percent by weight of the liquid developer. The colored particles generally have an average particle diameter as determined by measurement with a Brookhaven Particle Sizer or a Coulter Counter of from about 0.05 to about 4 microns, and preferably from about 0.1 to about 2 microns.

The liquid developer usually includes a charge control agent to provide the colored particles with charge thus enabling them, for example, to undergo electrophoresis in an electric field. Any suitable known charge control may be used. Examples of charge control agents include the lithium, cadmiun, calcium, manganese, magnesium and zinc salts of heptanoic acid; the barium, aluminum, cobalt, manganese, zinc, cerium, and zirconium salts of 2-ethyl hexanoic acid; the barium, aluminum, zinc, copper, and iron salts of stearic acid; the calcium, copper, manganese, nickel, zinc, and iron salts of naphthenic acid; ammonium lauryl sulfate, sodium dihexylsulfosuccinate, sodium dioctylsulfosuccinate, and aluminum diisopropyl salicylate. The charge control additive generally is present in an effective amount of, for example, from about 0.001 to about 2 percent by weight.

The liquid developers of the present invention also contain a polymeric material soluble in the liquid medium. By soluble is meant, for example in an embodiment of the present invention, that the polymeric material can be dissolved in the liquid medium at the 1 to 25, and preferably 5 to 10 percent by weight, level at the operating temperature of from about 15° to about 40° C. of the developer during development and at those temperatures of from about 0° to about 50° C. to which the developer will be exposed during shipment and storage. Examples of suitable polymers for this embodiment of the present invention include poly(2-ethyl-hexylmethacrylate); poly(isobutylene-co-isoprenes), such as Kalene 800, available from Hardman Company, poly(vinyltoluene) based copolymers, such as Pliolite OMS, available from Goodyear Company; and block copolymers, such as poly(styrene-b-hydrogenated butadiene) such as Kraton G 1701, available from Shell Company. The polymer becomes adsorbed onto the surfaces of the particles, which particles can be comprised of a polymer core with a coating thereover of a silica shell onto which have been chemically grafted reactive dyes, and functions as a stabilizer to maintain distance between the colored particles so as to prevent the particles from being attracted to one another and thus prevent agglomeration of the particles in the developer.

Liquid developers in an embodiment of the present invention can be prepared in the following procedure. An aqueous dispersion of the polymeric particles in an amount of from about 10 to about 40 weight percent is shaken or stirred mechanically and retained at a temperature of from about −20° C. to about 50° C. To this dispersion is added dropwise a tetraalkoxysilane in an amount of from about 1 to about 10 weight percent. After completion of the addition, the dispersion is stirred for a short time period of from about 1 to about 60 minutes. The dispersion is then added to a solution comprised of water and a concentrated alkaline component, such as ammonium hydroxide in amounts from about 2 to about 40 weight percent. The resulting mixture is then stirred at a constant temperature of from about −20° C. to about +50° C. for reaction times of from about 2 hours to about 48 hours. After being brought to 25° C., the mixture is treated with an aqueous acid solution to bring the pH of the suspension medium in a range of from about 7.5 to about 8.5. A solution in water of a reactive dye in an amount of from about 5 to about 30 weight percent is then added to the stirred dispersion. The mixture is stirred and maintained at a temperature of from about 20° C. to about 60° C. for reaction times of from 1 hour to 24 hours. After this time period, the mixture is brought to 25° C. The resulting colored particles comprised of polymer core with a coating of silica, onto which reactive dyes have been grafted, are separated from the dispersion by techniques such as centrifugation with a Beckman Centrifuge or ultrafiltration with a Minitan Acrylic System from Millipore. They can be further purified by suitable techniques such as ultrafiltration or repeated centrifugations and redispersions in water to remove excess unreacted dye. Subsequently, the particles are dried by known techniques such as freeze drying or spray drying.

These colored particles are then mixed with an ink hydrocarbon liquid medium, for example, in an attritor such as a Union Process 01 Attritor, available from Union Process Inc, Akron, Ohio, with heating at a temperature generally from about 50° to about 120° C. for a period of from about 30 minutes to about 2 hours. Generally, the liquid medium is present in the mixture in an amount of from about 80 percent to about 98 percent by weight, and preferably from about 82 to about 94 percent by weight. Subsequently, a charge control agent is added to the mixture in an amount of from about 0.5 to about 5 percent by weight, and preferably from about 1 to about 3 percent by weight. The resulting mixture is treated in an attritor at a temperature of from about 30° to about 80° C., and preferably from 40° to 60° C. for a period of from about 15 minutes to about 1 hour. In the ink composition of this embodiment of the present invention, the particles generally possess a charge to mass ratio of from about 50 to 2,000 microcoulombs per gram. The liquid developers in this embodiment of the present invention may be employed in imaging methods wherein an electrostatic latent image is formed on an imaging member, developed with the aforementioned developers composition illustrated herein, transferred to a suitable substrate, such as paper or transparency material, and thereafter affixed thereto. In addition, these liquid developers can be employed for direct printing processes including, for example, the printing process employed by the Versatec V-80 ™ printer.

The pigment for the compositions of the present invention is comprised of a polymer core which can generally be prepared by several polymerization techniques provided, for example, that they generate colloidally stable aqueous latexes of the desired effective diameter for example of from about 0.04 to about 4 microns and an effective size distribution of, for example, a GSD of from about 1.2 to about 1.8. Preferred preparation techniques include emulsion polymerization, such as described in *Encyclopedia of Polymer Science and Engineering*, John Wiley and Sons New York, 1985, Volume VI, pp 1., the disclosure of which is totally incorporated herein by reference. In an embodiment, the polymer core is prepared by an emulsifier-free latex formation process as described, for example, in R. H. Pelton and P. Chibante, "Colloids and Surfaces, 20, 247–256, (1988)", the disclosure of which is totally incorporated herein by reference. Particles formed by these processes generally range in average diameter of from about 0.05 to about 4.0 microns as determined by measurements with an apparatus, such as a Brookhaven Particle Sizer. Examples of polymers include acrylate polymers and polymers of vinyl monomers, such as poly(vinyl acetate), poly(N-vinyl-2-pyrrolidone), poly(methyl methacrylate), poly(methylacrylate), poly(ethyl acrylate), poly(ethyl methacrylate), poly(2-ethoxyethyl methacrylate), poly(butoxy ethoxy ethyl methacrylate), poly(dimethylaminoethyl methacrylate), poly(acrylic acid), poly(methacrylic acid), poly(acrylamide), poly(methacrylamide), poly(methyl acrylamide), poly(ethyl acrylamide), poly(ethyl methacrylamide), poly(N-isopropyl acrylamide), poly(N-isopropyl methacrylamide), poly(acrylonitrile), poly(vinyl chloride), poly(ureidoethyl vinyl ether), and polystyrene. In addition, the pigment core may include crosslinked polymers such as styrene-co-divinylbenzene polymer, methyl methacrylate-co-diethyleneglycol diacrylatepolymer, ethyl acrylate-co-diethyleneglycol diacrylate polymer, N-isopropylacrylamide-co-methylene dimethylacrylamide polymer, and the like. Preferred polymer example materials include homopolymers of methyl methacrylate, styrene, ethyl acrylate, and N-isopropylacrylamide, and copolymers of any of these monomers such as styrene-co-methyl methacrylate polymer, styrene-co-ethyl acrylate polymer, styrene-co-2-ethoxyethyl methacrylate polymer with a styrene content of from about 60 to about 95 percent by weight, and preferably of from about 70 to 85 percent by weight, acrylamide-co-N-isopropylacrylamide polymer, acrylamide-co-N-ethylacrylamide with an acrylamide content of from about 5 to about 30 percebt by weight, and the like.

The colored pigment particles can be prepared from stable aqueous solutions or latexes by first reacting the polymer cores with a silica precursor to effect the formation of a silica shell around the core, and then by dispersing the particles in an aqueous medium of pH value of from about 7.5 to about 8.5, adding to this dispersion a solution in water of a reactive dye in an amount of from about 5 to about 30 percent by weight, and subsequently maintaining the resulting mixture at a temperature of from about 20° to about 60° C. for a period of time ranging from about 1 to about 24 hours, bringing the mixture to room temperature, and removing the excess dye from the mixture by techniques such as centrifugation or ultrafiltration. These processes usually do not alter the sizes of the particles; accordingly, the sizes of the colored particles are controlled by those of the polymer aqueous latexes. For use of the colored particles of the present invention in applications, such as colorants for ink jet inks, particle sizes of from about 0.05 to about 0.2 micron can be selected, and in applications such as colorants for liquid electrophotographic developers, particle sizes of from about 0.1 to about 4 microns can be selected in embodiments thereof.

In addition, the present invention includes inks and processes wherein the polymer pigment particles coated with a silica shell, prepared as described herein, are treated with a silane coupling agent such as hydroxyalkyl silanes and aminoalkyl silanes prior to the coloration step. This additional step may be applied to promote the further coloration of the particles. An aqueous dispersion of the polymer particles in an amount of from about 10 to about 40 weight percent is shaken or stirred mechanically and retained at a temperature from about −20° C. to about 50° C. To this dispersion is added dropwise a tetraalkoxysilane in an amount of from about 1 to about 10 weight percent. After completion of the addition, the dispersion is stirred for a short time period of from about 1 to about 60 minutes. There is then added a solution comprised of water and a concentrated alkaline component, such as ammonium hydroxide in amounts from about 2 to about 40 weight percent. The resulting mixture is then stirred at a constant temperature of from about −20° C. to about +50° C. for reaction times of from about 2 hours to about 48 hours. A silane coupling agent in an amount of from about 1 to about 5 weight percent is then added dropwise to the dispersion, and the resulting mixture is stirred for an additional period of time ranging from about 30 minutes to 5 hours. After being brought to 25° C., the mixture is treated with an aqueous acid solution to bring the pH of the suspension medium in a range of from about 7.5 to about 8.5. A solution in water of a reactive dye in an amount of from about 5 to about 30 weight percent is then added to the stirred dispersion. The mixture is stirred and maintained at a temperature of from about 20° C. to about 60° C. for reaction times ranging from 1 hour to 24 hours. After this time period, the mixture is brought to 25° C. The resulting colored particles are separated from the dispersion by techniques such as centrifugation or ultrafiltration. They can be further purified by suitable known techniques such as ultrafiltration or repeated centrifugations and resuspensions in water to remove excess unreacted dye. The resulting particles are then dried by known methods such as freeze drying or spray drying.

Illustrative examples of tetraalkoxysilanes present in effective amounts of, for example, from about 1 to about 20 weight percent and other amounts selected for the inks, and the processes of the present invention include tetramethoxy silane, tetraethoxy silane, tetra-n-propoxy silane, tetra-i-propoxy silane, tetra-n-butoxy silane, tetra-s-butoxy silane, tetra-i-butoxy silane, tetra-pentoxy silane, tetrakis-(2-methoxyethoxy)silane, and the like. Generally, tetraalkoxysilanes wherein the alkoxy contains from about 1 to about 15, and preferably from 1 to about 5 carbon atoms, can be selected.

Illustrative examples of silane coupling agents selected for the inks and the processes of this invention include hydroxyalkyl silanes and aminoalkyl silanes. Preferably, the alkyl portion of the coupling agent has from about 2 to about 10 carbon atoms, and most preferably is a propyl group or a butyl group. Also suitable are hydroxyalkylaryl silanes, aminoalkylaryl silanes, hydroxyaryl silanes, and aminoaryl silanes. Examples of suitable coupling agents are aminopropyltriethoxy silane, N,N-(2'-hydroxyethyl)-3-aminopropyltriethoxy silane, 4-aminobutyltriethoxy silane, (aminoethyl)-(aminomethyl)-phenethyltriethoxy silane, p-aminophenyltriethoxy silane, 3-aminopropyltriethoxy silane, and the like.

Examples of bases selected for the hydrolysis reaction to form the silica shell and utilized in an effective amount of, for example, from about 2 to about 40 percent by weight, which bases effect the hydrolysis of the tetraalkoxy silanes, include ammonia and organic amines, such as for example methyl amine, ethyl amine, propylamine, and the like. As a source of ammonia, there can be selected concentrated ammonium hydroxide, gaseous ammonia, and ammonium salts, such as for example, ammonium acetate, ammonium chloride, and ammonium nitrate.

Illustrative examples of dyes present in effective amounts of, for example, from about 1 to about 35 weight percent, and other amounts include those that are water soluble and react rapidly and in high yield with hydroxyl groups, amino groups, silanol groups, and the like. Generally, suitable dyes for the present invention are of the class known as reactive dyes and widely used in the textile industry. These dyes are generally comprised of a chromophore soluble in water, such as an anthraquinone, a monoazo dye, a disazo dye, a phthalocyanine, a formazan copper complex, a triphenoxydiazine, and the like, to which is covalently attached a reactive group, such as a monochlorotriazine, a dichlorotriazine, a dichloroquinoxaline, a monoepoxide, a mono-(m'-carboxypyridinium)triazine, a 2,4,5-trihalogenopyrimidine, a 2,4-dichloropyrimidine, a 2,3-dichloroquinoxaline, a monofluorotriazine, a 4,5-dichloro-6-methyl-2-methylsulfonylpyrimidine, a 1,4-dichlorophthalazine, a chlorobenzothiazole, a sulfatoethylsulfone, a β-chloroethylsulfone, a 4,5-dichloro-6-pyridazone, an α,β-dibromopropionylamide, and the like. Examples of suitable dyes include Levafix Brilliant Yellow E-GA, Levafix Yellow E2RA, Levafix Black EB, Levafix Black E-2G, Levafix Black P-36A, Levafix Black PN-L, Levafix Brilliant Red E6BA, and Levafix Brilliant Blue EFFA, available from Bayer; Procion Turquoise PA, Procion Turquoise HA, Procion Turquoise H-5G, Procion Turquoise H-7G, Procion Red MX-5B, Procion Red MX-8B GNS, Procion Red G, Procion Yellow MX-8G, Procion Black H-EXL, Procion Black P-N, Procion Blue MX-R, Procion Blue MX-4GD, Procion Blue MX-G, and Procion Blue MX-2GN, available from ICI, Cibacron Red F-B, Cibacron Black BG, Lanasol Black B, Lanasol Red 5B, Lanasol Red B, and Lanasol Yellow 4G, available from Ciba-Geigy; Basilen Black P-BR, Basilen Yellow EG, Basilen Brilliant Yellow P-3GN, Basilen Yellow M-6GD, Basilen Brilliant Red P-3B, Basilen Scarlet E-2G, Basilen Red E-B, Basilen Red E-7B, Basilen Red M-5B, Basilen Blue E-R, Basilen Brilliant Blue P-3R, Basilen Black P-BR, Basilen Turquoise M-2G, Basilen Turquoise E-G, Basilen Green E-6B, available from BASF; Sumifix Turquoise Blue G, Sumifix Turquoise Blue H-GF, Sumifix Black B, Sumifix Black H-BG, Sumifix Yellow 2GC, Sumifix Supra Scarlet 2GF, and Sumifix Brilliant Red 5BF, available from Sumitomo Chemical; and the like.

The inks and the processes of the present invention can include more than one type of dye covalently attached to the same polymer particle. For example, a green particle may be prepared by forming particles coated with a silica shell, as described herein, and subsequently reacting the particles with a blue dye and a yellow dye to form a green particle. The color obtained may be controlled by adjusting the amounts of each dye present. Examples of mixtures of dyes include mixtures of Basilen Brilliant Yellow P-3GN in an amount of from about 40 to about 70 percent by weight of total dye, and preferably from about 50 to about 60 percent by weight and Basilen Turquoise M-2G in an amount of from about 30 to about 60 percent by weight of total dye, and preferably of from about 40 to about 50 percent by weight of total dye, mixtures of Levafix Brilliant Yellow E-GA in an amount of from about 40 to about 70 percent by weight of total dye, and preferably from about 50 to about 60 percent by weight and Levafix Brilliant Red E6BA in an amount of from about 30 to about 60 percent by weight of total dye, and preferably of from about 40 to about 50 percent by weight of total dye, and mixtures of Levafix Brilliant Yellow E-GA in an amount of from about 40 to about 70 percent by weight of total dye, and preferably from about 50 to about 60 percent by weight and Procion Turquoise H-7G in an amount of from about 30 to about 60 percent by weight of total dye, and preferably of from about 40 to about 50 percent by weight of total dye.

The liquid developer compositions of the present invention are particularly useful in liquid development systems, such as those illustrated in the aforementioned British Patent Publication and U.S. Pat. No. 4,794,651, and color proofing processes. More specifically, these processes involve depositing an electrostatic charge pattern on a photoreceptor or a dielectric surface, and then toning the electrostatic image with the ink of the present invention, followed by electrostatically transferring to plain paper. In addition, the ink compositions of the present invention are also useful for enabling the development of colored electrostatic latent images, particularly those contained on an imaging member charged positively or negatively. Examples of imaging members that may be selected are various known organic photoreceptors, including layered photoreceptors. Illustrative examples of layered photoresponsive devices include those with a substrate, a photogenerating layer, and a transport layer as disclosed in U.S. Pat. No. 4,265,990, the disclosure of which is totally incorporated herein by reference. Examples of photogenerating layer pigments are trigonal selenium, metal phthalocyanines, metal free phthalocyanines, and vanadyl phthalocyanine. Transport material examples include various diamines dispersed in resinous binders. Other imaging members that can be selected are ionographic surfaces of various dielectric materials, such as polycarbonate polysulfone fluoropolymers, and anodized aluminum alone or filled with wax expanded fluoropolymers.

The ink jet compositions of the present invention are selected for known ink jet imaging and printing processes. There are two types of ink jet printing: continuous stream and drop-on-demand. In continuous stream ink jet systems, ink is emitted in a continuous stream under pressure through at least one nozzle. The stream is perturbed, causing it to break up into droplets. At the break-up point the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, they are much simpler than the continuous stream type. There are two types of drop-on-demand ink jet systems. One type of drop-on-demand system has as its major components an ink-filled channel having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high-quality prints. The second type of drop-on-demand system is known as thermal ink jet or bubble jet, and produces high velocity droplets and allows very close spacing of the nozzles. The major components of this type of drop-on-demand system are an ink-filled channel having a nozzle on one end and a heat generating resistor near the nozzle. Printing signals representing digital information originate an electric current pulse in a resistive layer within each ink passageway near the nozzle causing the ink in the immediate vicinity to evaporate almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles the drop-on-demand ink jet printers provide simpler, lower cost devices than their continuous stream counterparts, and yet have substantially the same high speed printing capability.

The operating sequence of the known thermal ink jet system begins with a current pulse through the resistive layer in the ink-filled channel, the resistive layer being in close proximity to the orifice for that channel. Heat is transferred from the resistor to the ink. The ink becomes superheated far above its normal boiling point, and for water-based inks, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to vaporization. The expansion of the bubble forces a droplet of ink out of the nozzle, and once the excess heat is removed, the bubble collapses on the resistor. At this point, the resistor is no longer being heated because the current pulse has passed and, concurrently with bubble collapse, the droplet is propelled at a high speed in a direction towards a recording medium. The resistive layer encounters a severe cavitational force by the collapse of the bubble, which tend to erode it. Subsequently, the ink channel refills by capillary action. This entire bubble formation and collapse sequence occurs in about 10 microseconds. The channel can be refired after a 100 to 500 microsecond minimum dwell time to enable the channel to be refilled and to enable the dynamic refilling factors to become somewhat dampened. Thermal ink jet processes are well known and are described, for example, in U.S. Pat. Nos. 4,601,777; 4,251,824; 4,410,899; 4,412,224; and 4,532,530, the disclosures of each of which are totally incorporated herein by reference.

The invention will now be described in detail with reference to specific preferred embodiments thereof, it being understood that these examples are intended to be illustrative only. The invention is not intended to be limited to the materials, conditions, or process parameters recited herein, it being noted that all parts and percentages are by weight unless otherwise indicated.

EXAMPLE I

Preparation of Cyan Particles

To 5.0 grams of MP-4009 poly(methyl methacrylate) particles (from Soken Chemical and Engineering Company) dispersed in 225 milliliters of deionized water in a 500 milliliter round-bottom flask equipped with a magnetic stirrer were added 1.04 milliliters of tetraethoxy silane. After 5 minutes, 22.5 milliliters of concentrated ammonium hydroxide were added. The reaction mixture was stirred at 25° C. for 17 hours. Thereafter, aqueous hydrochloric acid was added dropwise until the pH of the suspension medium reached a value of 8.0. To the resulting suspension was added a solution of 1.5 grams of Procion Turquoise H-7G in 20 milliliters of water. The mixture was stirred at 25° C. for 20 hours. Thereafter, the colored particles were separated by centrifugation at 35,000 rpm, 15° C. for 10 minutes then resuspended in 500 milliliters of deionized water. The particles were then washed with 4 liters of deionized water by ultrafiltration with a Minitan Acrylic System from Millipore Inc. The suspension of purified cyan-colored particles was concentrated by evaporation of the water under reduced pressure at a temperature of from about 40° to about 60° C. with a Rotary Evaporator to approximately 50 milliliters. The particles were isolated from the suspension by freeze drying from water for 48 hours. There resulted a cyan-colored powder comprised of a poly(methyl methacrylate) core, a coating of silica, and the reactive dye Procion Turquoise H-7G, covalently attached thereto, 4.7 grams, which particles had a diameter of 0.45 micron, as determined by analysis with a Brookhaven Particle Sizer.

EXAMPLE II

Preparation of Magenta Particles

To 5.0 grams of MP-4009 poly(methyl methacrylate) particles (from Soken Chemical and Engineering Company) dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. Thereafter, aqueous hydrochloric acid was added dropwise until the pH of the suspension medium reached a value of 8.0. To the resulting suspension was added a solution of 1.5 grams of Levafix Brilliant Red E6BA in 20 milliliters of water. The mixture was stirred at 25° C. for 20 hours. Thereafter, the colored particles were separated by centrifugation at 35,000 rpm, 15° C. for 10 minutes. Subsequently, the particles were resuspended in 500 milliliters of deionized water, then washed with 4 liters of deionized water by ultrafiltration with a Minitan Acrylic System from Millipore Inc. The suspension of purified magenta-colored particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a red-colored powder, comprised of a poly(methyl methacrylate) core coated with silica, and the reactive dye Levafix Brilliant Red E6BA covalently attached thereto, 4.2 grams, which particles has a diameter of 0.45 micron, as determined by analysis with a Brookhaven Particle Sizer.

EXAMPLE III

Preparation of Yellow Particles

To 5.0 grams of MP-4009 poly(methyl methacrylate) particles (from Soken Chemical and Engineering Company) dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. Thereafter, aqueous hydrochloric acid was added dropwise, until the pH of the suspension medium reached a value of 8.0. To the resulting suspension was added a solution of 1.5 grams of Procion Yellow MX-8G in 20 milliliters of water. The mixture was stirred at 25° C. for 20 hours. Thereafter, the colored particles were separated by centrifugation at 35,000 rpm, 15° C. for 10 minutes. Subsequently, the particles were resuspended in 500 milliliters of deionized water and washed with 4 liters of deionized water by ultrafiltration with a Minitan Acrylic System from Millipore Inc. The suspension of purified yellow-colored particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a yellow powder, 4.4 grams, comprised of poly(methyl methacrylate) core coated with silica, and the reactive dye Procion Yellow MX-8G covalently attached, which particles has a diameter of 0.45 micron, as determined by analysis with a Brookhaven Particle Sizer.

EXAMPLE IV

Preparation of Cyan Particles

To 5.0 grams of MP-4009 poly(methyl methacrylate) particles (from Soken Chemical and Engineering Company) dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. Thereafter, 1.5 milliliters of aminopropyltriethoxy silane were added dropwise. The mixture was stirred at 25° C. for 2 hours. Then aqueous hydrochloric acid was added dropwise until the pH of the suspension medium reached a value of 8.0. To the resulting suspension was added a solution of 1.5 grams of Procion Turquoise H-7G in 20 milliliters of water. The mixture was stirred at 25° C. for 20 hours. Thereafter, the colored particles were separated by centrifugation at 35,000 rpm, 15° C. for 10 minutes. Subsequently, the particles were resuspended in 500 milliliters of deionized water and washed with 4 liters of deionized water by ultrafiltration with a Minitan Acrylic System from Millipore Inc. The suspension of purified cyan-colored particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a cyan-colored powder, comprised of poly(methyl methacrylate) core coated with silica, and the reactive dye Procion Turquoise H-7G covalently attached thereto, 4.3 grams, which particles had a diameter of 0.46 micron, as determined by analysis with a Brookhaven Particle Sizer.

EXAMPLE V

Preparation of Black Particles

To 5.0 grams of MP-4009 poly(methyl methacrylate) particles (from Soken Chemical and Engineering Company) dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. Thereafter, 1.5 milliliters of aminopropyltriethoxysilane were added dropwise. The mixture was stirred at 25° C. for 2 hours. Then aqueous hydrochloric acid was added dropwise until the pH of the suspension medium reached a value of 8.0. To the resulting suspension was added a solution of 2.0 grams of Levafix Black EB in 20 milliliters of water. The mixture was stirred at 25° C. for 20 hrs. Thereafter, the colored particles were separated by centrifugation at 35,000 rpm, 15° C. for 10 minutes. Subsequently, the particles were resuspended in 500 milliliters of deionized water. The particles were then washed with 4 liters of deionized water by ultrafiltration with a Minitan Acrylic System from Millipore Inc. The suspension of purified black particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a black powder comprised of poly(methyl methacrylate) core coated with silica, and the reactive dye Levafix Black EB covalently attached thereto, 4.3 grams, which particles had a diameter of 0.46 micron, as determined by analysis with a Brookhaven Particle Sizer.

EXAMPLE VI

Preparation of Cyan Particles

To 3.0 grams of polystyrene particles (40 nanometers in diameter, prepared as described in M. A. Linné, A. Klein, J. H. Sperling, and G. D. Wignall, *J. Macromol. Sci, Phys.*, B27(243), pages 181 to 216 (1988)) dispersed in 225 milliliters of deionized water in a 500 milliliter round-bottom flask equipped with a magnetic stirrer were added 1.04 milliliters of tetraethoxy silane. After 5 minutes, 22.5 milliliters of concentrated ammonium hydroxide were added. The reaction mixture was stirred at 25° C. for 17 hours. The mixture was stirred at 25° C. for 2 hours. Then aqueous hydrochloric acid was added dropwise until the pH of the suspension medium reached a value of 8.0. To the resulting suspension was added a solution of 2.0 grams of Procion Turquoise HA in 20 milliliters of water. The mixture was stirred at 25° C. for 20 hours. The resulting cyan particles were washed with 4 liters of deionized water by ultrafiltration with a Minitan Acrylic System from Millipore Inc. The suspension of purified cyan particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a cyan powder comprised of polystyrene core coated with silica, and the reactive dye Procion Turquoise HA covalently attached thereon, 2.8 grams, which particles had a diameter of 0.04 micron, as determined by analysis with a Brookhaven Particle Sizer.

EXAMPLE VII

Preparation of Black Particles

To 3.0 grams of polystyrene particles (40 nanometers in diameter prepared as described in M. A. Linné, A. Klein, J. H. Sperling, and G. D. Wignall, *J. Macromol. Sci, Phys.*, B27(243), pages 181 to 216 (1988)) dispersed in 225 milliliters of deionized water in a 500 milliliter round-bottom flask equipped with a magnetic stirrer were added 1.04 milliliters of tetraethoxy silane. After 5 minutes, 22.5 milliliters of concentrated ammonium hydroxide were added. The reaction mixture was stirred at 25° C. for 17 hours. The mixture was stirred at 25° C. for 2 hours. Then aqueous hydrochloric acid was added dropwise until the pH of the suspension medium reached a value of 8.0. To the resulting suspension was added a solution of 2.0 grams of Levafix Black EB in 20 milliliters of water. The mixture was stirred at 25° C. for 20 hours. The resulting cyan particles were washed with 5 liters of deionized water by ultrafiltration with a Minitan Acrylic System from Millipore Inc. The suspension of purified cyan particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a cyan powder comprised of polystyrene core coated wth silica, and the reactive dye Levafix Black EB covalently attached thereon, 2.8 grams, which particles had a diameter of 0.04 micron, as determined by analysis with a Brookhaven Particle Sizer.

EXAMPLE VIII

Preparation of Cyan Particles

To 6.0 grams of crosslinked poly(N-isopropylacrylamide) particles (600 nanometers in diameter prepared as described in R. H. Pelton and P. Chibante, *Colloids and Surfaces*, 20, 247 to 256, 1986), the disclosure of which is totally incorporated herein by reference, dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. The mixture was stirred at 25° C. for 2 hours. Then aqueous hydrochloric acid was added dropwise until the pH of the suspension medium reached a value of 8.0. To the resulting suspension was added a solution of 2.0 grams of Procion Turquoise HA in 20 milliliters of water. The mixture was stirred at 25° C. for 20 hours. Thereafter, the colored particles were separated by centrifugation at 35,000 rpm, 15° C. for 10 minutes. Subsequently, the particles were resuspended in 500 milliliters of deionized water. The resulting cyan particles were washed with 4 liters of deionized water by ultrafiltration with a Minitan Acrylic System from Millipore Inc. The suspension of purified cyan particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a cyan powder, comprised of crosslinked poly(N-isopropylacrylamide) core coated with silica, and the reactive dye Procion Turquoise HA covalently attached thereto, 5.2 grams, which particles had a diameter of 0.65 micron, as determined by analysis with a Brookhaven Particle Sizer.

EXAMPLE IX

Preparation of Green Particles

To 3.0 grams of polystyrene particles (40 nanometers in diameter prepared as described in M. A. Linné, A. Klein, J. H. Sperling, and G. D. Wignall, *J. Macromol. Sci. Phys.*, B27(243), pages 181 to 216 (1988)) dispersed in 225 milliliters of deionized water in a 500 milliliter round-bottom flask equipped with a magnetic stirrer were added 1.04 milliliters of tetraethoxysilane. After 5 minutes, 22.5 milliliters of concentrated ammonium hydroxide were added. The reaction mixture was stirred at 25° C. for 17 hours. The mixture was stirred at 25° C. for 2 hours. Then aqueous hydrochloric acid was added dropwise until the pH of the suspension medium reached a value of 8.0. To the resulting suspension was added a solution of 1.0 gram of Procion Turquoise HA and 1.8 grams of Procion Yellow MX-8G in 20 milliliters of water. The mixture was stirred at 25° C. for 20 hours. The resulting cyan particles were washed with 4 liters of deionized water by ultrafiltration with a Minitan Acrylic System from Millipore Inc. The suspension of purified green particles was concentrated by evaporation of the water under reduced pressure at a temperature of from about 40° to about 60° C. with a Rotary Evaporator to approximately 50 milliliters. The particles were isolated from the suspension by freeze drying for 48 hours. There resulted a green powder comprised of polystyrene core coated with silica, and the reactive dye Procion Turquoise HA covalently attached thereto, 2.8 grams, which particles had a diameter of 0.04 micron, as determined by analysis with a Brookhaven Particle Sizer.

EXAMPLE X

Preparation of Liquid Developers

To 100 milliliters of Isopar TM G were added 4.0 grams of the cyan particles prepared according to Example I and 1.5 grams poly(2-ethyl hexyl methacrylate) obtained from Polysciences Inc. The resulting mixture was stirred mechanically for 6 hours. A stable colloidal dispersion was obtained whose particle size was 0.50 micron. The resulting dispersion was diluted to 1 weight percent of particles by the addition of a further 300 milliliters of Isopar TM G. To 300 milliliters of the dispersion was added 0.12 gram of 12 percent zirconium octoate obtained from Nuodex Canada Inc. After equilibrating for 24 hours, the liquid toner was imaged in a Versatec V-80 TM electrophotographic printer. The resulting cyan images had excellent edge acuity and evidenced no feathering as determined by optical microscopy with a Leitz Microscope. They were resistant to rubbing such as, for example, a finger rubbing or rubbing with a blade, indicating the images exhibited acceptable fix on the paper. The cyan prints had a waterfastness of 0.98 percent, a value calculated from the ratio of the optical density of a printed solid area soaked in water for 2 minutes to that of the same area before the treatment with water. Cyan prints on Jujo FC995 TM silica coated paper had an optical density of 1.03 as measured with a Macbeth densitometer. Bench tests showed that the particles were positively charged and exhibited a charge to mass ratio of 300 microcoulombs per gram.

EXAMPLE XI

Preparation of a Cyan Ink for Ink Jet Printing

To 40 milliliters of deionized water and 1.8 milliliters of ethylene glycol were added 2.0 grams of the cyan particles prepared according to Example VI. The resulting mixture was subjected to sonication for 15 minutes. A stable colloidal suspension was obtained whose particle size diameter was 0.06 micron. This ink was incorporated into a Hewlett Packard Desk Jet printer and jetted. The resulting cyan prints on Xerox Corporation 4024 TM paper had edge acuity superior to that of prints made on the same paper with a dye-based ink obtained from the commercial Diablo C-150 TM Ink Jet Printer, as determined by observation of the prints by optical microscopy with a Leitz Microscope, and showed no feathering as determined by observation of the prints by optical microscopy with a Leitz Microscope. The solid areas of the prints had an optical density of 0.96 as determined by a Macbeth densitometer. They possessed a waterfastness of 95 percent, a value calculated from the ratio of the optical density of a printed solid area soaked in water for 2 minutes to that of the same area before the treatment with water. Cyan prints on Jujo FC995 TM silica coated paper had an optical density of 1.03 as determined by a Macbeth densitometer, and a waterfastness of 96 percent.

EXAMPLE XII

Preparation of a Magenta Ink for Ink Jet Printing

To 40 milliliters of deionized water and 1.8 milliliters of ethylene glycol were added 2.5 grams of the magenta particles prepared according to Example II. The resulting mixture was subjected to sonication for 15 minutes. A stable colloidal suspension was obtained, whose particle size was 0.45 micron. This ink was incorporated into a Hewlett Packard Desk Jet printer and jetted. The resulting magenta prints on Xerox Corporation 4024 TM paper had edge acuity superior to that of prints made on the same paper with a dye-based ink obtained from the commercial Diablo C-150 TM Ink Jet Printer, as determined by observation of the prints by optical microscopy with a Leitz Microscope and showed no feathering as determined by observation of the prints by optical microscopy with a Leitz Microscope. The solid areas of the prints had an optical density of 1.05 as determined with a Macbeth densitometer. They possessed a waterfastness of 96 percent, a value calculated from the ratio of the optical density of a printed solid area soaked in water for 2 minutes to that of the same area before the treatment with water. Magenta prints on Jujo FC995 TM silica coated paper had an optical density of 1.05 as determined by a Macbeth densitometer and a waterfastness of 96 percent.

EXAMPLE XIII

Preparation of a Green Ink for Ink Jet Printing

To 40 milliliters of deionized water and 1.8 milliliters of ethylene glycol were added 2.5 grams of the green particles prepared according to Example IX. The resulting mixture was subjected to sonication for 15 minutes. A stable colloidal suspension was obtained, whose particle size was 0.05 micron. This ink was incorporated into a Hewlett Packard Desk Jet printer and jetted. The resulting green prints on 4024 TM Paper had edge acuity superior to that of prints made on the same paper with a dye-based ink obtained from the commercial Diablo C-150 TM Ink Jet Printer as determined by observation of the prints by optical microscopy with a Leitz Microscope and showed no feathering as determined by observation of the prints by optical microscopy with a Leitz Microscope. The solid areas of the prints had an optical density of 1.04 as determined with a Macbeth densitometer. They possessed a waterfastness of 94 percent, a value calculated from the ratio of the optical density of a printed solid area soaked in water for 2 minutes to that of the same area before the treatment with water. Green prints on Jujo FC995 TM silica coated paper had an optical density of 1.08 as determined by a Macbeth densitometer and a waterfastness of 95 percent.

EXAMPLE XIV

Preparation of a Black Ink for Ink Jet Printing

To 40 milliliters of deionized water and 1.8 milliliters of ethylene glycol were added 2.0 grams of the black particles prepared according to Example VII and 0.3 gram of Daxad 19 TM. The resulting mixture was subjected to sonication for 15 minutes. A stable colloidal suspension was obtained, whose particle size was 0.05 micron. This ink was incorporated into a Hewlett Packard Desk Jet printer and jetted. The resulting black prints on 4024 TM Paper had edge acuity superior to that of prints made on the same paper with a dye based ink obtained from the commercial Diablo C-150 TM Ink Jet Printer as determined by observation of the prints by optical microscopy with a Leitz Microscope and showed no feathering as determined by observation of the prints by optical microscopy with a Leitz Microscope. The solid areas of the prints had an optical density of 1.12 as determined with a Macbeth densitometer. They possessed a waterfastness of 96 percent, a value calculated from the ratio of the optical density of a printed solid area soaked in water for 2 minutes to that of the same area before the treatment with water. Green prints on Jujo FC995 TM silica coated paper had an optical density of 1.24 as determined by a Macbeth densitometer and a waterfastness of 95 percent.

As optional components for the aqueous ink compositions or ink jet compositions, there may be selected in effective amounts biocides, humectants, and similar known components.

Other modifications of the present invention may occur to those skilled in the art subsequent to a review of the present application. These modifications, including equivalents thereof are intended to be included within the scope of the present invention.

What is claimed is:

1. An aqueous ink jet composition comprised of a solvent and pigment particles comprised of an insoluble polymeric core present in an amount of from about 85 to about 99 weight percent and a silica shell present in an amount of from about 1 to about 15 weight percent onto which dyes are covalently bonded, and wherein the average diameter of the pigment particles is from between about 0.05 to about 4 microns, and the pigment particle size distribution possesses a geometric standard deviation of from between about 1.2 and about 1.7.

2. An aqueous ink jet composition comprised of water, a glycol solvent and pigment particles comprised of an insoluble polymer core present in an amount of from about 85 to about 99 weight percent and a silica shell present in an amount of from about 1 to about 15 weight percent onto which dyes are covalently bonded, and wherein the average diameter of the pigment particles is from between about 0.05 to about 4 microns, and the pigment particle size distribution possesses a geometric standard deviation of from between about 1.2 and about 1.7.

3. An aqueous ink in accordance with claim 1 containing a biocide.

4. An aqueous ink in accordance with claim 1 containing a humectant.

5. An aqueous ink in accordance with claim 1 wherein the solvent is an aliphatic glycol.

6. An aqueous ink in accordance with claim 2 containing a dispersing component.

7. A liquid developer composition comprised of a liquid hydrocarbon medium, a polymeric material soluble in the liquid medium, a charge control agent, and pigment particles comprised of an insoluble polymeric core present in an amount of from about 85 to about 99 weight percent with a coating thereover of a silica shell present in an amount of from about 1 to about 15 weight percent onto which have been chemically grafted reactive dyes, and wherein the average diameter of the pigment particles is from between about 0.05 to about 4 microns, and the pigment particle size distribution possesses a geometric standard deviation of from between about 1.2 and about 1.7.

8. An ink in accordance with claim 2 wherein the polymer is selected from the group consisting of poly(2-ethyl-hexylmethacrylate), poly(isobutylene-co-isoprene), poly(vinyltoluene)-based polymers, and poly(styrene-b-hydrogenated butadiene).

9. An ink in accordance with claim 1 wherein the solvent is an alkylene glycol selected from the group consisting of methylene glycol, ethylene glycol, propylene glycol, butylene glycol, 1,5-pentanediol, hexylene glycol, and 1,2,6-hexanetriol.

10. An ink in accordance with claim 1 wherein the polymer core is selected from the group consisting of acrylate polymers and polymers of vinyl monomers.

11. An ink in accordance with claim 10 wherein the polymer is poly(vinyl acetate), poly(N-vinyl-2-pyrrolidone), poly(methyl methacrylate), poly(methylacrylate), poly(ethyl acrylate), poly(ethyl methacrylate), poly(2-ethoxymethyl methacrylate), poly(butoxy ethoxy ethyl methacrylate), poly(dimethylaminoethyl methacrylate), poly(acrylic acid), poly(methacrylic acid), poly(acrylamide), poly(methacrylamide), poly(methyl acrylamide), poly(ethyl acrylamide), poly(ethyl methacrylamide), poly(N-isopropyl acrylamide), poly(N-isopropyl methacrylamide), poly(acrylonitrile), poly(vinyl chloride), poly(ureido-ethyl vinyl ether), or polystyrene.

12. An ink in accordance with claim 2 wherein the polymer core is selected from the group consisting of acrylate polymers and polymers of vinyl monomers.

13. An ink in accordance with claim 12 wherein the polymer is poly(vinyl acetate), poly(N-vinyl-2-pyrrolidone), poly(methyl methacrylate), poly(methylacrylate), poly(ethyl acrylate), poly(ethyl methacrylate), poly(2-ethoxyethyl methacrylate), poly(butoxy ethoxy ethyl methacrylate), poly(dimethylaminoethyl methacrylate), poly(acrylic acid), poly(methacrylic acid), poly(acrylamide), poly(methacrylamide), poly(methyl acrylamide), poly(ethyl acrylamide), poly(ethyl methacrylamide), poly(N-isopropyl acrylamide), poly(N-isopropyl methacrylamide), poly(acrylonitrile), poly(vinyl chloride), poly(ureido-ethyl vinyl ether), or polystyrene.

14. An ink in accordance with claim 2 wherein the silica shell is prepared by hydrolysis of silica precursors selected from the group consisting of tetramethoxy silane, tetraethoxy silane, tetra-n-propoxy silane, tetra-iso-propoxy silane, tetra-n-butoxy silane, tetra-secondary-butoxy silane, tetra-iso-butoxy silane, tetra-pentoxy silane, and tetrakis-(2-methoxyethoxy)silane.

15. An ink in accordance with claim 2 wherein the reactive dye is selected from the group consisting of an anthraquinone, a monoazo dye, a disazo dye, a phthalocyanine, a formazan copper complex, and a triphenoxydiazine, to which is covalently attached a reactive group, such as a monochlorotriazine, a dichlorotriazine, a dichloroquinoxaline, a monoepoxide, a mono-(m'-carboxypyridinium)-triazine, a 2,4,5-trihalogenopyrimidine, a 2,4-dichloropyrimidine, a 2,3-dichloroquinoxaline, a monofluorotriazine, a 4,5-dichloro-6-methyl-2-methylsulfonylpyrimidine, a 1,4-dichlorophthalazine, a chlorobenzothiazole, a sulfatoethylsulfone, a β-chloroethylsulfone, a 4,5-dichloro-6-pyridazone, and an α,β-dibromopropionylamide.

16. An ink in accordance with claim 13 wherein the dye is Levafix Brilliant Yellow E-GA, Levafix Yellow E2RA, Levafix Black EB, Levafix Black E-2G, Levafix Black P-36A, Levafix Black PN-L, Levafix Brilliant Red E6BA, and Levafix Brilliant Blue EFFA; Procion Turquoise PA, Procion Turquoise HA, Procion Turquoise H-5G, Procion Turquoise H-7G, Procion Red MX-5B, Procion Red MX-8B GNS, Procion Red G, Procion Yellow MX-8G, Procion Black H-EXL, Procion Black P-N, Procion Blue MX-R, Procion Blue MX-4GD, Procion Blue MX-G, and Procion Blue MX-2GN, Cibacron Black BG, Lanasol Black B, Lanasol Red 5B, Lanasol Red B, and Lanasol Yellow 4G; Basilen Black P-BR, Basilen Yellow EG, Basilen Brilliant Yellow P-3GN, Basilen Yellow M-6GD, Basilen Brilliant Red P-3B, Basilen Scarlet E-2G, Basilen Red E-B, Basilen Red E-7B, Basilen Red M-5B, Basilen Blue E-R, Basilen Brilliant Blue P-3R, Basilen Black P-BR, Basilen Turquoise M-2G, Basilen Turquoise E-G, Basilen Green E-6B; Sumifix Turquoise Blue G, Sumifix Turquoise Blue H-GF, Sumifix Black B, Sumifix Black H-BG, Sumifix Yellow 2GC, Sumifix Supra Scarlet 2GF, or Sumifix Brilliant Red 5BF.

17. A ink in accordance with claim 10 with a charge director selected from the group consisting of zirconium octoate, iron naphthenate, and mixtures thereof enabling a positively charged developer.

18. A ink in accordance with claim 10 with a charge director selected from the group consisting of lecithin, basic barium petronate and polyisobutylene succiminide enabling a negatively charged developer.

19. An aqueous ink jet composition comprised of a solvent and pigment particles comprised of a polymeric core and a silicon oxide shell onto which dyes are covalently bonded, and wherein the average diameter of the pigment particles is from between about 0.05 to about 4 microns, and the pigment particle size distribution possesses a geometric standard deviation of from between about 1.2 and about 1.7.

20. An aqueous ink jet composition comprised of water, a glycol solvent and pigment particles comprised of an insoluble polymer core and a silicon oxide shell onto which dyes are covalently bonded, and wherein the average diameter of the pigment particles is from between about 0.05 to about 4 microns, and the pigment particle size distribution possesses a geometric standard deviation of from between about 1.2 and about 1.7.

21. An aqueous ink jet composition in accordance with claim 20 wherein the colored particles are thermally stable.

22. An ink in accordance with claim 1 wherein the silica shell has a thickness of from between about 0.002 to about 0.030 micron.

23. An ink in accordance with claim 1 wherein the silica shell has a thickness of from between about 0.005 to about 0.01 micron.

24. An ink in accordance with claim 2 wherein the silica shell has a thickness of from between about 0.002 to about 0.030 micron.

25. An ink in accordance with claim 2 wherein the silica shell has a thickness of from between about 0.005 to about 0.01 micron.

* * * * *